United States Patent
Hsu

(10) Patent No.: US 8,939,283 B2
(45) Date of Patent: Jan. 27, 2015

(54) PROTECTIVE BAG

(71) Applicant: Fu-Yi Hsu, New Taipei (TW)

(72) Inventor: Fu-Yi Hsu, New Taipei (TW)

( * ) Notice: Subject to any disclaimer, the term of this patent is extended or adjusted under 35 U.S.C. 154(b) by 149 days.

(21) Appl. No.: 13/684,095

(22) Filed: Nov. 21, 2012

(65) Prior Publication Data

US 2013/0233732 A1    Sep. 12, 2013

(30) Foreign Application Priority Data

Mar. 9, 2012    (TW) .............................. 101204327 U

(51) Int. Cl.
*F16M 11/06*    (2006.01)
*H05K 5/03*    (2006.01)
*A45C 11/00*    (2006.01)

(52) U.S. Cl.
CPC  *H05K 5/03* (2013.01); *A45C 11/00* (2013.01); *A45C 2011/001* (2013.01); *A45C 2011/002* (2013.01); *A45C 2011/003* (2013.01); *G06F 2200/1633* (2013.01); *Y10S 206/805* (2013.01)
USPC .......................... 206/45.24; 206/320; 206/805

(58) Field of Classification Search
USPC ................ 206/45.26, 45.24, 45.25, 805, 320; 361/679.09, 679.44, 679.56, 679.02; 455/575.8
See application file for complete search history.

(56) References Cited

U.S. PATENT DOCUMENTS 6,772,879 B1 *    8/2004    Domotor .................... 206/45.23
2012/0006950 A1 *    1/2012    Vandiver .................... 248/176.3

* cited by examiner

*Primary Examiner* — David Fidei

(57) ABSTRACT

A protective bag for a portable electronic device is provided, which comprises a first cover, a second cover connecting the first cover and a support element. The first cover and the second cover can be folded relative to each other for covering two opposite sides of the portable electronic device. The support element is disposed on a first inner surface of the first cover and has a first foldable plate and a second foldable plate. The first foldable plate and the second foldable plate can be folded relative to each other for being received between the first cover and the second cover. The first foldable plate and the second foldable plate can be unfolded relative to each other as well for slanting the first foldable plate on the first inner surface with a support provided by the second foldable plate.

19 Claims, 3 Drawing Sheets

PROTECTIVE BAG

CROSS-REFERENCE TO RELATED APPLICATIONS

This application claims priority from Taiwan Patent Application No. 101204327, filed 2012, Mar. 9, the contents of which are hereby incorporated by reference in their entirety for all purposes.

FIELD OF THE INVENTION

The present invention generally relates to a protective bag, and more particularly to a protective bag for a portable electronic device.

DESCRIPTION OF THE RELATED ART

With the development of technology, various portable electronic devices, such as a multimedia player (MP3, MP4 and so on), a cell phone, a personal digital assistant (PDA), a hand-held game console, an electronic book (E-book), a tablet personal computer (tablet PC), a netbook, a notebook and so on, have become an integral part of modern life to many people. To compare with the traditional desktop PC, a main advantage of the portable electronic device is easy to get carried. As a result, in recent years, we can see people operating the portable electronic devices anytime and anywhere.

It should be noted that only some portable electronic devices, such as the netbook, the notebook and some kinds of the hand-held game consoles mentioned above, are generally designed into two bodies respectively disposed with a keyboard and a screen and capable of being folded relative to each other. In such portable electronic devices, the body disposed with the screen can stand up with a support provided by the body disposed with the keyboard, and an inclination of the screen relative to the keyboard is adjustable as well, so as to enable the portable electronic devices to be held or put on a carrying surface (such as a table surface) to be watched or operated based upon an operation requirement of a user. In contrast, the other portable electronic devices are generally formed as an integral design and necessary to be assisted in standing on the carrying surface with an additional cradle or another supporting component.

However, the cradle is not always carried with the portable electronic devices by the user, and a proper supporting component is not readily available. As a result, it is necessary to provide a supporting component with advantages of easily to be carried with the portable electronic device and capable of stably supporting the portable electronic device to stand on a carrying surface.

SUMMARY OF THE INVENTION

The present invention is directed to a protective bag, which enables the portable electronic device to slant on a first inner surface with a support provided by a support element within the protective bag.

The present invention provides a protective bag for a portable electronic device, which comprises a first cover, a second cover, and a support element. The first cover has a first inner surface. Furthermore, the second cover connects with the first cover, and has a second inner surface, wherein the first cover and the second cover are capable of being folded relative to each other, so as to enable the first inner surface and the second inner surface to cover two opposite sides of the portable electronic device. In addition, the support element is disposed on the first inner surface, and has a first foldable plate and a second foldable plate, wherein the first foldable plate and the second foldable plate are capable of being folded relative to each other, so as to be received between the first cover and the second cover. Moreover, the first foldable plate and the second foldable plate are capable of being unfolded relative to each other, so as to enable the first foldable plate to slant on the first inner surface with a support provided by the second foldable plate.

According to an embodiment of the present invention, the support element further has a position limiting element connecting with the first foldable plate and the second foldable plate. In addition, the position limiting element is capable of limiting a maximum unfolded angle to be smaller than 180 degrees after the second foldable plate is unfolded relative to the first foldable plate, so as to enable the first foldable plate to slant on the first inner surface. In a preferred embodiment, the first foldable plate can have a first lower surface facing the first inner surface and a first side edge adjacent to the first inner surface, while the second foldable plate can have a second lower surface facing the first inner surface and a second side edge distant from the first foldable plate, wherein a first end of the position limiting element can connect with one of the first lower surface and the first side edge, and a second end of the position limiting element can connect with one of the second lower surface and the second side edge. In a further preferred embodiment, a length of the position limiting element can be shorter than a sum of a first distance and a second distance, wherein the first distance is measured from the first end of the position limiting element to a junction where the first foldable plate connecting with the second foldable plate, and the second distance is measured from the second end of the position limiting element to the junction. In another preferred embodiment, the position limiting element can comprise at least one of a rope and a belt.

According to an embodiment of the present invention, the support element further has an elastic element connecting with the first foldable plate and the second foldable plate, wherein the elastic element is capable of generating a return force for enabling the first foldable plate and the second foldable plate to be unfolded relative to each other when the first foldable plate and the second foldable plate are folded relative to each other. In a preferred embodiment, the first foldable plate can have a first lower surface facing the first inner surface, a first upper surface distant from the first inner surface and a first side edge adjacent to the first inner surface, while the second foldable plate can have a second lower surface facing the first inner surface, a second upper surface distant from the first inner surface and a second side edge distant from the first foldable plate, wherein the elastic element can be disposed at a side of the support element distant from the first inner surface, and a first end of the elastic element can connect with one of the first upper surface and the first side edge, while a second end of the elastic element can connect with one of the second upper surface and the second side edge. Alternatively, the elastic element can be disposed at a side of the support element facing the first inner surface as well, and the first end of the elastic element can connect with one of the first lower surface and the first side edge, while the second end of the elastic element can connect with one of the second lower surface and the second side edge. In another preferred embodiment, the elastic element can comprise at least one of an elastic, a rubber band, a plastic flat spring, a metal flat spring and a torsion spring.

According to an embodiment of the present invention, the first foldable plate is connected between and capable of being folded relative to the first inner surface and the second foldable plate. In a preferred embodiment, the second foldable plate is capable of being folded between the first foldable plate and the first inner surface, and further capable of being folded toward the first inner surface along with the first foldable plate, so as to be received between the first cover and the second cover along with the first foldable plate. In another preferred embodiment, the second foldable plate is capable of being unfolded relative to the first inner surface along with the first foldable plate, and further capable of being unfolded relative to the first foldable plate, so as to slant on the first inner surface along with the first foldable plate. In a further preferred embodiment, the first cover further can have a position limiting portion disposed on the first inner surface, wherein a side edge of the second foldable plate distant from the first foldable plate is capable of leaning against the position limiting portion after the second foldable plate is unfolded relative to the first foldable plate. In one more preferred embodiment, the support element can further have a position limiting hinge with a maximum unfolded angle, which is smaller than 180 degrees, and the second foldable plate can connect with and is capable of being folded relative to the first foldable plate via the position limiting hinge.

According to an embodiment of the present invention, the first foldable plate and the second foldable plate respectively connect with the first inner surface and are capable of respectively being folded toward the first inner surface, so as to be received between the first cover and the second cover, and are capable of respectively being unfolded away from the first inner surface, so as to enable the first foldable plate to slant on the first inner surface with the support provided by the second foldable plate. In a preferred embodiment, the first foldable plate can have a first lower surface facing the first inner surface, a first side edge adjacent to the first inner surface and a third side edge opposite to the first side edge, while the second foldable plate can have a second lower surface facing the first inner surface, a second side edge adjacent to the first inner surface and a fourth side edge opposite to the second side edge, wherein the fourth side edge can lean against one of the first lower surface and the third side edge when the first foldable plate and the second foldable plate are respectively unfolded away from the first inner surface, so as to enable the first foldable plate to slant on the first inner surface with the support provided by the second foldable plate. In a further preferred embodiment, the fourth side edge can lean against one of the first lower surface and the third side edge via a fastening set, a magnet set, a close fit structure, an embedding structure or a friction force. In another preferred embodiment, the support element can further have at least an elastic element connecting between the first inner surface and the first foldable plate and/or between the first inner surface and the second foldable plate, and the elastic element is capable of generating a return force for enabling the first foldable plate and the second foldable plate to be unfolded relative to each other when the first foldable plate and the second foldable plate are folded relative to each other. In a further preferred embodiment, the elastic element can comprise at least one of an elastic, a rubber band, a plastic flat spring, a metal flat spring, a torsion spring and a spiral spring.

According to an embodiment of the present invention, the first cover further has a dent formed on the first inner surface and capable of receiving the support element.

Accordingly, the portable electronic device can directly lean on the first foldable plate for operation after not only the first cover and the second cover are unfolded relative to each other but also the first foldable plate and the second foldable plate are unfolded relative to each other. As a result, the protective bag disclosed in the present invention can not only be used for protecting the portable electronic device from damage, but also readily assisting the portable electronic device in slanting on a carrying surface with the support element therein.

DETAILED DESCRIPTION OF THE INVENTION

Reference will now be made in detail to specific embodiments of the present invention. Examples of these embodiments are illustrated in the accompanying drawings. While the invention will be described in conjunction with these specific embodiments, it will be understood that it is not intended to limit the invention to these embodiments. In fact, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations are not described in detail in order not to obscure the present invention.

Figure 1:
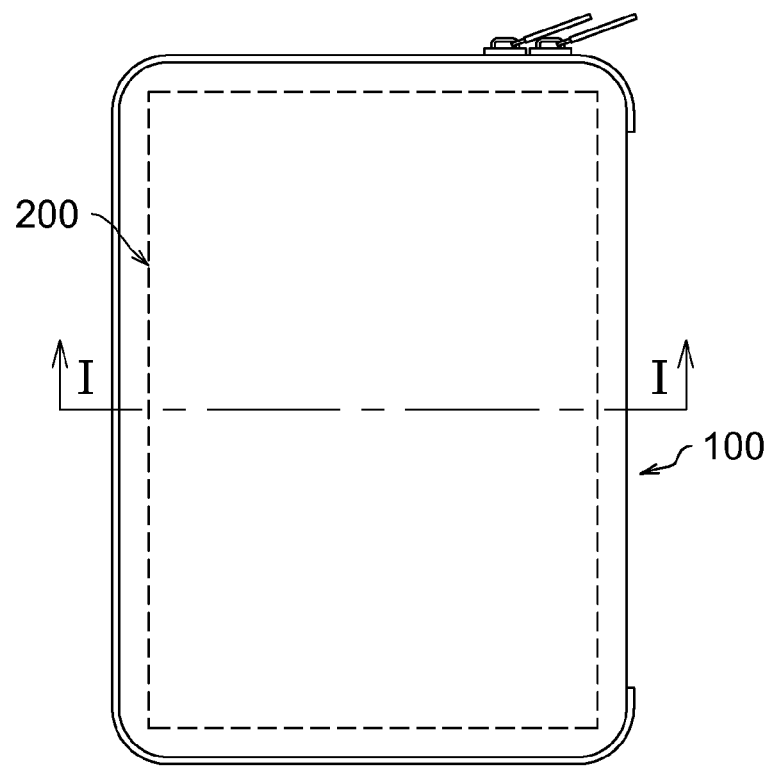
FIG. 1 illustrates a top view of a protective bag according to an embodiment of the present invention.
Figure 2:
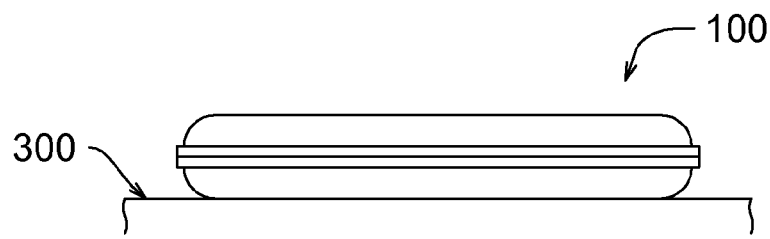
FIG. 2 illustrates a front view of the protective bag as illustrated in FIG. 1.
Figure 3:
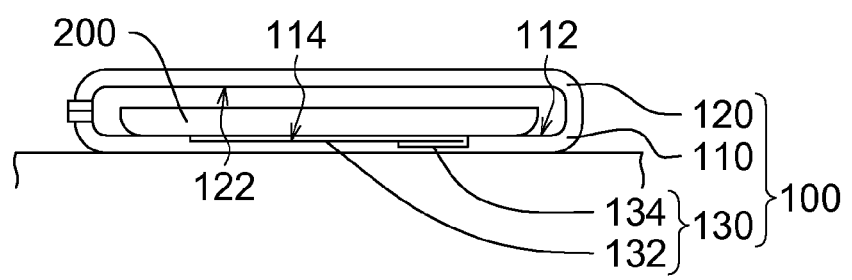
FIG. 3 illustrates a cross-sectional view of the protective bag along the line I-I as illustrated in FIG. 1, wherein a portable electronic device is enclosed therein.
Figure 4:
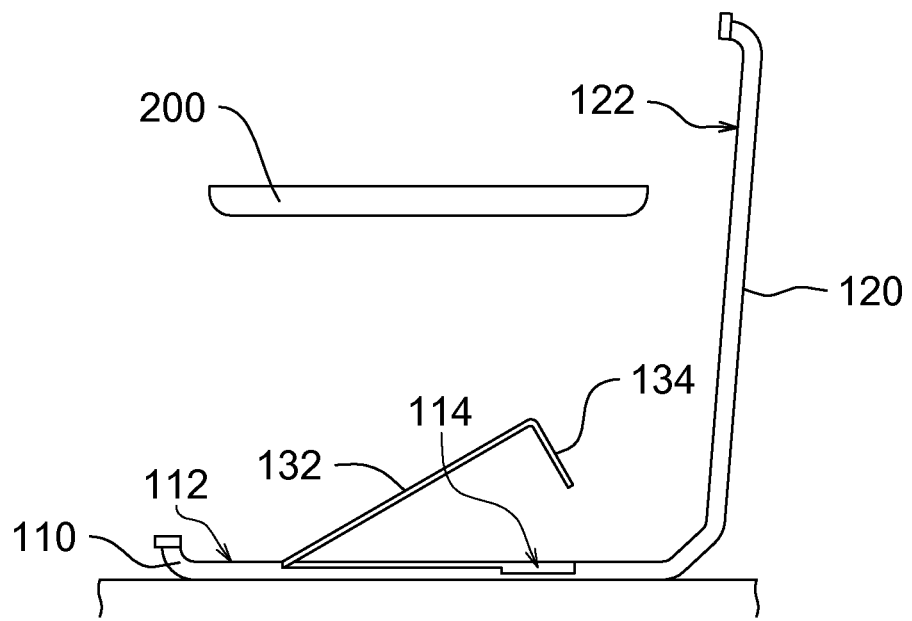
FIG. 4 illustrates another cross-sectional view of the protective bag as illustrated in FIG. 3, wherein the protective bag is unfolded, the portable electronic device is took out of the protective bag and the support element is unfolded.
Figure 5:
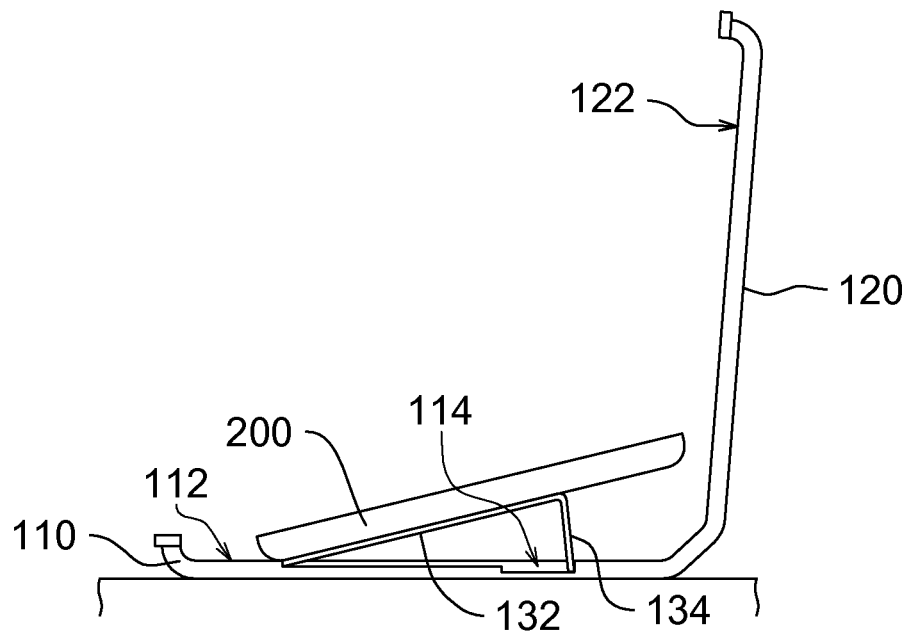
FIG. 5 illustrates another cross-sectional view of the support element as illustrated in FIG. 4 used for supporting the portable electronic device.

FIG. 1 illustrates a top view of a protective bag according to an embodiment of the present invention, while FIG. 2 illustrates a front view of the protective bag as illustrated in FIG. 1. In addition, FIG. 3 illustrates a cross-sectional view of the protective bag along the line I-I as illustrated in FIG. 1, wherein a portable electronic device is enclosed therein, while FIG. 4 illustrates another cross-sectional view of the protective bag as illustrated in FIG. 3, wherein the protective bag is unfolded, the portable electronic device is took out of the protective bag and the support element is unfolded. Furthermore, FIG. 5 illustrates another cross-sectional view of the support element as illustrated in FIG. 4 used for supporting the portable electronic device. In the following embodiments, the same or similar components illustrated in different embodiments refer to the same symbols.

Referring to FIG. 1 and FIG. 2 together first, the protective bag 100 provided in the present invention is capable of being used for receiving a portable electronic device 200, and the portable electronic device 200 is capable of being carried on a carrying surface 300 by the protective bag 100. In the present preferred embodiment, the portable electronic device 200 is exemplarily illustrated as a portable electronic device with an integral design, such as a multimedia player (MP3, MP4 and so on), a cell phone, a PDA, a hand-held game console, a tablet PC and so on. However, in other non-illustrated embodiments, the portable electronic device can further be applied to a portable electronic device designed into two bodies capable of being folded relative to each other, such as a netbook, a notebook and so on.

Referring to FIG. 3, the protective bag 100 comprises a first cover 110, a second cover 120 connecting with the first cover 110 and a support element 130. In the present preferred embodiment, the first cover 110 and the second cover 120 are, for example but not limited to, connecting with each other and formed as an integral part, and are capable of being folded relative to each other as illustrated in FIG. 3, so as to enable a first inner surface 112 of the first cover 110 and a second inner surface 122 of the second cover 120 to respectively cover a lower side and an upper side of the portable electronic device 200, i.e. to respectively cover a rear surface and a display surface of the portable electronic device 200. Further, the support element 130 is disposed on the first inner surface 112, and has a first foldable plate 132 and a second foldable plate 134. The first foldable plate 132 and the second foldable plate 134 are capable of being folded relative to each other as illustrated in FIG. 3, so as to be received between the first cover 110 and the second cover 120. Moreover, the first foldable plate 132 can further slant on the first inner surface 112 with a support provided by the second foldable plate 134, so as to enable the portable electronic device 200 to slant on the first inner surface 112 with a support provided by the support element 130.

In detail, in the present preferred embodiment, based upon an orientation as illustrated in FIG. 4 and FIG. 5, a left side edge of the first foldable plate 132 is, for example but not limited to, connected with and capable of being folded relative to the inner surface 112 by sewing, fastening, attaching, adhesive and so on. In addition, a left side edge of the second foldable plate 134 is, for example but not limited to, connected with a right side of the first foldable plate 132, and capable of being folded relative to and formed as an integral part with the first foldable plate 132, while a right side edge of the second foldable plate 134 is, for example but not limited to, a free end. As a result, the second foldable plate 134 is capable of being folded between the first foldable plate 132 and the first inner surface 112 and further capable of being folded toward the first inner surface 112 along with the first foldable plate 132, so as to be received between the first cover 110 and the second cover 120 along with the first foldable plate 132 as illustrated in FIG. 3. In contrast, as illustrated in FIG. 4 instead, the second foldable plate 134 is capable of being unfolded relative to the first inner surface 112 along with the first foldable plate 132 and further capable of being unfolded relative to the first foldable plate 132 after the portable electronic device 200 is took out. As a result, the second foldable plate 134 can slant on the first inner surface 112 along with the first foldable plate 132 as illustrated in FIG. 5.

It should be noted that the first cover 110 in the present preferred embodiment can further has a dent 114, wherein the dent 114 is, for example but not limited to, formed on the first inner surface 112, and capable of receiving the support element 130 therein as illustrated in FIG. 3. As a result, the right side edge of the second foldable plate 134 can lean against a lower right corner inside the dent 114 after the second foldable plate 134 is unfolded relative to the first foldable plate 132, so as to enable the support element 130 to support the portable electronic device 200 stably by maintaining an included angle between the first foldable plate 132 and the second foldable plate 134. However, it should be directly and unambiguously understood by those of skill in the art that the present invention should not be limited in the embodiment disclosed above.

For example, in the other non-illustrated embodiments, the first cover can also design without any dent for receiving the support element. In another word, the first inner surface can be a viscosity surface formed by a silicon material or a rough surface formed by wool, cloth and so on. In such a case, the right side edge of the second foldable plate can be held on the first inner surface with a friction provided by the first inner surface after the second foldable plate is unfolded relative to the first foldable plate, so as to maintain the included angle between the first foldable plate and the second foldable plate. Alternatively, the first cover can also have a position limiting portion, for example but is not limited to a bump protruding from the first inner surface, disposed on the first inner surface. In such a case, the right side edge of the second foldable plate can be held on the first inner surface by leaning against the position limiting portion after the second foldable plate is unfolded relative to the first foldable plate, so as to maintain the included angle between the first foldable plate and the second foldable plate. Further, the support element can also have a position limiting hinge with a maximum unfolded angle, which is smaller than 180 degrees, and the second foldable plate can be connected with and capable of being folded relative to the first foldable plate via the position limiting hinge. As a result, it is possible to limit a maximum angle after the second foldable plate is unfolded relative to the first foldable plate.

Furthermore, the first cover can further have a first fastener disposed on the first inner surface, and the support element can further have a second fastener disposed on the right side edge of the second foldable plate. In such a case, the right side edge of the second foldable plate can be held on the first inner surface when the first fastener and the second fastener are fastened together after the second foldable plate is unfolded relative to the first foldable plate, so as to maintain the included angle between the first foldable plate and the second foldable plate. In the present preferred embodiment, the first fastener and the second fastener can be a zipper set, a Velcro® set, a snap button set, a pair of permanent magnets with opposite magnet polarities, a combination of a permanent magnet and a ferromagnetic material artifact, a combination of a hook and a locking aperture, a combination of a pin and an inserting aperture, and a combination listed above.

In order to help those of skill in the art to clearly understand the practicable variations of the structure of the present invention, a plurality of exemplary embodiments of the present invention about the structure of the support element 130 and the manners for maintaining the maximum unfolded angle between the second foldable plate 134 and the first foldable plate 132 are further disclosed as below.

Figure 6:
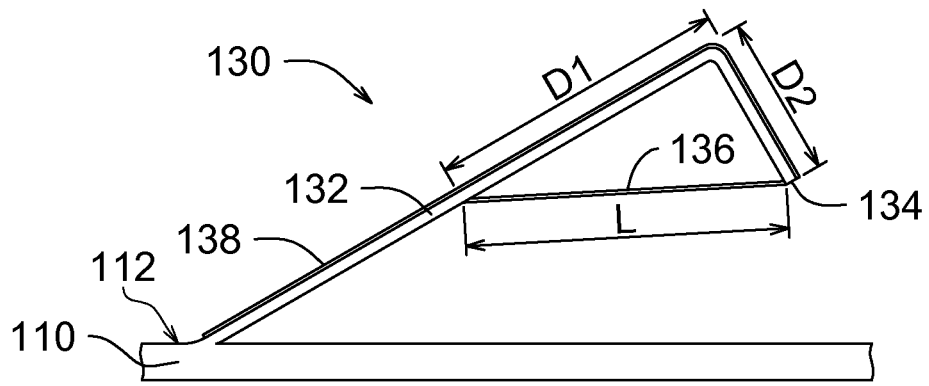
FIG. 6 illustrates a cross-sectional view of an unfolded support element according to an embodiment of the present invention.

FIG. 6 illustrates a cross-sectional view of an unfolded support element according to an embodiment of the present invention. Referring to FIG. 6, the support element 130 in the present preferred embodiment can further has a position limiting element 136 connecting to the first foldable plate 132 and the second foldable plate 134, wherein the position limiting element 136 is, for example but not limited to, at least one of a rope, a belt and a two bar linkage. In the present preferred embodiment, based upon an orientation as illustrated in FIG. 6, a left end of the position limiting element 136 is, for example but not limited to, connecting with a lower surface of the first foldable plate 132, a right end of the position limiting element 136 is, for example but not limited to, connecting with a right side edge of the second foldable plate 134, and a length L of the position limiting element 136 is shorter than a sum of a first distance D1 and a second distance D2. Hence, the maximum unfolded angle between the second foldable plate 134 and the first foldable plate 132 will be limited to be smaller than 180 degrees by the position limiting element 136.

Similarly, it should be directly and unambiguously understood by those of skill in the art that the present invention should not be limited in the embodiment disclosed above. In other non-illustrated embodiments, the left end of the position limiting element can connect with the lower surface of the first foldable plate, while the right end of the position limiting element can connect with the lower surface of the second foldable plate. Alternatively, the left end of the position limiting element can connect with a left side edge of the first foldable plate, while the right end of the position limiting element can connect with the lower surface or the right side edge of the second foldable plate. In another word, the maximum unfolded angle between the second foldable plate and the first foldable plate can be effectively limited as long as a total length of the position limiting element is shorter than the sum of the first distance and the second distance, wherein the first distance is measured from the first end of the position limiting element to a junction where the first foldable plate connecting with the second foldable plate, while the second distance is measured from the second end of the position limiting element to the junction.

In addition, the support element 130 can further has an elastic element 138 connecting to the first foldable plate 132 and the second foldable plate 134, wherein the elastic element 138 is, for example but not limited to, at least one of an elastic, a rubber band, a plastic flat spring, a metal flat spring and a torsion spring. In the present preferred embodiment, based upon the orientation as illustrated in FIG. 6, the elastic element 138 is, for example but not limited to, disposed on both of the upper surfaces of the first foldable plate 132 and the second foldable plate 134, wherein a left end of the elastic element 138 is, for example but not limited to, connecting with the left side edge of the first foldable plate 132, and a right end of the elastic element 138 is, for example but not limited to, connecting with the right side edge of the second foldable plate 134. As a result, the elastic element 138 can generate a return force capable of enabling the first foldable plate 132 and the second foldable plate 134 to be unfolded relative to each other when the second foldable plate 134 is folded relative to the first foldable plate 132. In another word, the return force generated by the elastic element 138 automatically unfolds the second foldable plate 134 relative to the first foldable plate 132 as illustrated in FIG. 6 if the second foldable plate 134 folded relative to the first foldable plate 132 is released.

Similarly, it should be directly and unambiguously understood by those of skill in the art that the present invention should not be limited in the embodiment disclosed above. In the other non-illustrated embodiments, the left end of the elastic element can connect with the left side edge of the first foldable plate, while the right end of the elastic element can connect with the upper surface of the second foldable plate. Alternatively, the left end of the elastic element can connect with the upper surface of the first foldable plate, while the right end of the elastic element can connect with the upper surface or the right side edge of the second foldable plate as well. In addition, the elastic element can be disposed on both of the lower surfaces of the first foldable plate and the second foldable plate as well if the elastic element is a combination of at least one of a plastic flat spring, a metal flat spring, a torsion spring and any other compressible elastic element. In such a case, the left end of the elastic element can connect with one of the left side edge and the lower surface of the first foldable plate, and the right end of the elastic element can connect with one of the right side edge and the lower surface of the second foldable plate. It should be noted that, in such an instance, the support element can design without any position limiting element as illustrated in FIG. 6 if the return force provided by the elastic element at an initial status (i.e. at a status without being neither compressed nor stretched) can maintain the included angle between the second foldable plate and the first foldable plate in the specific angle.

Figure 7:
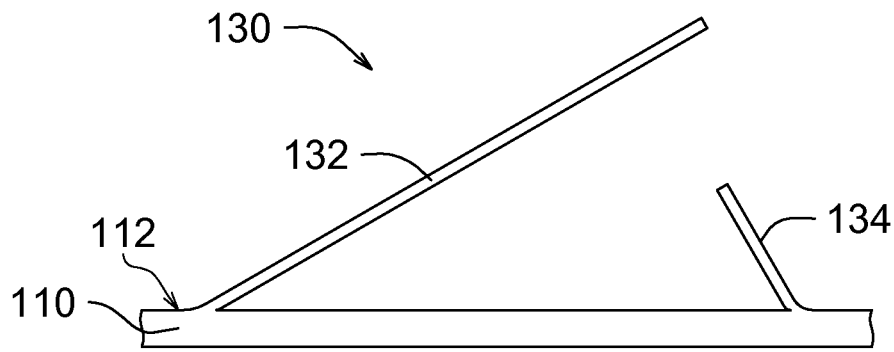
FIG. 7 illustrates a cross-sectional view of an unfolded support element according to another embodiment of the present invention.
Figure 8:
FIG. 8 illustrates another cross-sectional view of the support element as illustrated in FIG. 7, wherein the support element is folded.

FIG. 7 illustrates a cross-sectional view of an unfolded support element according to another embodiment of the present invention, while FIG. 8 illustrates another cross-sectional view of the support element as illustrated in FIG. 7, wherein the support element is folded. Referring to FIG. 7 and FIG. 8 together, in the present preferred embodiment, both of the first foldable plate 132 and the second foldable plate 134 connect with the first inner surface 112. Moreover, both of the first foldable plate 132 and the second foldable plate 134 can be folded toward the first inner surface 112 as illustrated in FIG. 8, so as to be received between the first cover 110 and the second cover 120 as illustrated in FIG. 3. Alternatively, both of the first foldable plate 132 and the second foldable plate 134 can be unfolded away from the first inner surface 112 as illustrated in FIG. 7, so as to enable the first foldable plate 132 to slant on the first inner surface 112 with the support provided by the second foldable plate 134 as illustrated in FIG. 5.

In detail, in the present preferred embodiment, based on the orientation as illustrated in FIG. 7 and FIG. 8, the left side edge of the second foldable plate 134 can lean against one of the lower surface and the right side edge of the first foldable plate 132 via a fastening set, a magnet set, a close fit structure, an embedding structure or a friction force after both of the first foldable plate 132 and the second foldable plate 134 are unfolded away from the first inner surface 112 as illustrated in FIG. 7, so as to enable the first foldable plate 132 to slant on the first inner surface 112 with the support provided by the second foldable plate 134.

In addition, in the other non-illustrated embodiments, the support element can further has an elastic element connecting between the first inner surface and the first foldable plate, wherein the elastic element is, for example but not limited to, at least one of an elastic, a rubber band, a plastic flat spring, a metal flat spring, a torsion spring and a spiral spring. In another word, the elastic and the rubber band can be used for connecting the upper surface of the first foldable plate and the first inner surface since they can provide the return force by being stretched merely, while the spiral spring can be used for connecting the lower surface of the first foldable plate and the first inner surface only. In contrast, the plastic flat spring, the metal flat spring, the torsion spring and the spiral spring can be used for connecting not only the upper surface of the first foldable plate and the first inner surface but also the lower surface of the first foldable plate and the first inner surface since they can provide the return force by being stretched and compressed.

Accordingly, the elastic element generate a return force capable of unfolding the first foldable plate relative to the first inner surface when the first foldable plate is folded toward the first inner surface as illustrated in FIG. 8. In another word, the return force generated by the elastic element can automatically unfolds the first foldable plate relative to the first inner surface as illustrated in FIG. 7 if the folded first foldable plate is released. Similarly, the support element can has an elastic element connecting between the first inner surface and the second foldable plate as well, wherein the structures, the connecting manners and the utilities of the elastic element of the support element are substantially the same as those of the elastic element connecting between the first inner surface and the first foldable plate, and thus are omitted herein.

In summary, in the present invention, the portable electronic device can directly lean on the first foldable plate for operation when the first foldable plate slants on the first inner surface with the support provided by the second foldable plate since the first cover and the second cover can be unfolded relative to each other and the first foldable plate and the second foldable plate can be unfolded relative to each other. As a result, the protective bag of the present invention can not only be used for protecting the portable electronic device, but also be used for readily assisting the portable electronic device in slanting on the carrying surface with the support element therein without carrying or looking for an additional proper support element. Besides, with the assistance of the elastic element, the folded support element can further be automatically unfolded when it is released, so that the protective bag is convenient to be used.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A protective bag for a portable electronic device, wherein the protective cover comprises:
    a first cover, having a first inner surface;
    a second cover, connecting with the first cover, and having a second inner surface, wherein the first cover and the second cover are capable of being folded relative to each other, so as to enable the first inner surface and the second inner surface to cover two opposite sides of the portable electronic device; and
    a support element, disposed on the first inner surface, and having a first foldable plate, a second foldable plate and an elastic element connecting with the first foldable plate and the second foldable plate, wherein the first foldable plate and the second foldable plate are capable of being folded relative to each other, so as to be received between the first cover and the second cover and generate a return force by the elastic element, and the first foldable plate and the second foldable plate are capable of being unfolded relative to each other by the return force, so as to enable the first foldable plate to slant on the first inner surface with a support provided by the second foldable plate.

2. The protective bag as claimed in claim 1, wherein the support element further has a position limiting element connecting with the first foldable plate and the second foldable plate, and the position limiting element is capable of limiting a maximum unfolded angle to be smaller than 180 degrees after the second foldable plate is unfolded relative to the first foldable plate, so as to enable the first foldable plate to slant on the first inner surface.

3. The protective bag as claimed in claim 2, wherein the first foldable plate has a first lower surface facing the first inner surface and a first side edge adjacent to the first inner surface, the second foldable plate has a second lower surface facing the first inner surface and a second side edge distant from the first foldable plate, a first end of the position limiting element connects with one of the first lower surface and the first side edge, and a second end of the position limiting element connects with one of the second lower surface and the second side edge.

4. The protective bag as claimed in claim 3, wherein a length of the position limiting element is shorter than a sum of a first distance and a second distance, the first distance is measured from the first end of the position limiting element to a junction where the first foldable plate connecting with the second foldable plate, and the second distance is measured from the second end of the position limiting element to the junction.

5. The protective bag as claimed in claim 2, wherein the position limiting element comprises at least one of a rope and a belt.

6. The protective bag as claimed in claim 1, wherein the first foldable plate has a first upper surface distant from the first inner surface and a first side edge adjacent to the first inner surface, the second foldable plate has a second upper surface distant from the first inner surface and a second side edge distant from the first foldable plate, the elastic element is disposed at a side of the support element distant from the first inner surface, a first end of the elastic element connects with one of the first upper surface and the first side edge, and a second end of the elastic element connects with one of the second upper surface and the second side edge.

7. The protective bag as claimed in claim 1, wherein the first foldable plate has a first lower surface facing the first inner surface and a first side edge adjacent to the first inner surface, the second foldable plate has a second lower surface facing the first inner surface and a second side edge distant from the first foldable plate, the elastic element is disposed at a side of the support element facing the first inner surface, a first end of the elastic element connects with one of the first lower surface and the first side edge, and a second end of the elastic element connects with one of the second lower surface and the second side edge.

8. The protective bag as claimed in claim 1, wherein the elastic element comprises at least one of an elastic, a rubber band, a plastic flat spring, a metal flat spring and a torsion spring.

9. The protective bag as claimed in claim 1, wherein the first foldable plate is connected between and capable of being folded relative to the first inner surface and the second foldable plate.

10. The protective bag as claimed in claim 9, wherein the second foldable plate is capable of being folded between the first foldable plate and the first inner surface, and further capable of being folded toward the first inner surface along with the first foldable plate, so as to be received between the first cover and the second cover along with the first foldable plate.

11. The protective bag as claimed in claim 9, wherein the second foldable plate is capable of being unfolded relative to the first inner surface along with the first foldable plate, and further capable of being unfolded relative to the first foldable plate, so as to slant on the first inner surface along with the first foldable plate.

12. The protective bag as claimed in claim 11, wherein the first cover further has a position limiting portion disposed on the first inner surface, and a side edge of the second foldable plate distant from the first foldable plate is capable of leaning against the position limiting portion after the second foldable plate is unfolded relative to the first foldable plate.

13. The protective bag as claimed in claim 9, wherein the support element further has a position limiting hinge with a maximum unfolded angle, which is smaller than 180 degrees, and the second foldable plate connects with and is capable of being folded relative to the first foldable plate via the position limiting hinge.

14. The protective bag as claimed in claim 1, wherein the first foldable plate and the second foldable plate respectively connect with the first inner surface and are capable of respectively being folded toward the first inner surface, so as to be received between the first cover and the second cover, and are capable of respectively being unfolded away from the first inner surface, so as to enable the first foldable plate to slant on the first inner surface with the support provided by the second foldable plate.

15. The protective bag as claimed in claim 14, wherein the first foldable plate has a first lower surface facing the first inner surface, a first side edge adjacent to the first inner surface and a third side edge opposite to the first side edge, the second foldable plate has a second lower surface facing the first inner surface, a second side edge adjacent to the first inner surface and a fourth side edge opposite to the second side edge, and the fourth side edge leans against one of the first lower surface and the third side edge when the first foldable plate and the second foldable plate are respectively unfolded away from the first inner surface, so as to enable the first foldable plate to slant on the first inner surface with the support provided by the second foldable plate.

16. The protective bag as claimed in claim 15, wherein the fourth side edge leans against one of the first lower surface and the third side edge via a fastening set, a magnet set, a close fit structure, an embedding structure or a friction force.

17. The protective bag as claimed in claim 14, wherein the support element further has at least an elastic element connecting between the first inner surface and the first foldable plate and/or between the first inner surface and the second foldable plate, and the elastic element is capable of generating a return force for enabling the first foldable plate and the second foldable plate to be unfolded relative to each other when the first foldable plate and the second foldable plate are folded relative to each other.

18. The protective bag as claimed in claim 17, wherein the elastic element comprises at least one of an elastic, a rubber band, a plastic flat spring, a metal flat spring, a torsion spring and a spiral spring.

19. The protective bag as claimed in claim 1, wherein the first cover further has a dent formed on the first inner surface and capable of receiving the support element.

* * * * *